(12) United States Patent
Burdo

(10) Patent No.: US 7,129,797 B2
(45) Date of Patent: Oct. 31, 2006

(54) WIDEBAND GAUSSIAN WHITE NOISE SOURCE

(75) Inventor: Gennady Burdo, Maalot (IL)

(73) Assignee: International Business Machines Corporation, Armonk, NY (US)

(*) Notice: Subject to any disclaimer, the term of this patent is extended or adjusted under 35 U.S.C. 154(b) by 48 days.

(21) Appl. No.: 10/904,328

(22) Filed: Nov. 4, 2004

(65) Prior Publication Data

US 2006/0097806 A1    May 11, 2006

(51) Int. Cl.
*G06F 7/58* (2006.01)
(52) U.S. Cl. .................... 331/78; 708/251; 708/253
(58) Field of Classification Search ............... 331/78; 708/251, 253
See application file for complete search history.

(56) References Cited

U.S. PATENT DOCUMENTS 6,630,669 B1 * 10/2003 Chin et al. ................. 250/330

OTHER PUBLICATIONS

Title: Review Of Noise In Semiconductor Devices And Modeling Of Noise In Surrounding Gate Mosfet Author: Bipin Rajendran (under guidance of Prof. Fabian Pease Date: Dec. 2001.
Title: Prospects For Charge Sensitive Amplifiers In Scaled CMOS Author: Paul O'Connor*, Gianluigi De Geronimo Date: Mar. 27, 2001.

* cited by examiner

*Primary Examiner*—Joseph Chang
(74) *Attorney, Agent, or Firm*—Ira D. Blecker

(57) ABSTRACT

A white noise generator comprising a MOSFET operated in its linear region and having zero source-drain DC bias current. This is achieved by connecting the source or drain terminal of the MOSFET to a gate terminal of a MOSFET amplifier that may be implemented as a multi-stage differential amplifier. Such a noise source avoids the effect of DC current responsible for generating 1/f noise and has a small physical size that results in low parasitic capacitance of the device itself.

4 Claims, 3 Drawing Sheets

WIDEBAND GAUSSIAN WHITE NOISE SOURCE

FIELD OF THE INVENTION

This invention relates to wideband Gaussian white noise generators.

BACKGROUND OF THE INVENTION

A source of white noise is a key element in Random Number Generator (RNG) circuits, which are used widely in hardware encryption devices. White noise is a type of random noise that may be generated in electronic circuits mostly as a result of random motion of electrons at non-zero temperature. It is know to generate white noise using linear resistors as well as active devices such as diodes and transistors. A linear resistor generates white noise whose power is proportional to the resistance, so that in order to obtain high amplitude white noise, a high resistance element is required. Usually, high resistance is achieved by increasing the length to width ratio of the resistor. Increasing the dimensions of the resistor in this manner enlarges its parasitic capacitance, which in turn reduces the noise bandwidth and thus reduces the noise amplitude. Thus the parasitic capacitance acts against the increased resistance and it is known that in practice the noise amplitude is actually determined by parasitic capacitance of the resistor and the input capacitance of the load.

"Review of noise in semiconductor devices and modeling of noise in surrounding gate MOSFET" by Bipin Rajendran published by the Department of Electrical Engineering Stanford University, December 2001 presents an introduction to different types of noise associated with CMOS with particular reference to white noise and to the problems associated with thermal noise and 1/f noise, also known as excess or flicker noise. White Gaussian noise is a name for a random process with Gaussian probability distribution behavior and has a autocorrelation function of a Dirac delta function type, which means that if the process is sampled at any two or more points of time the samples will have no correlation to each other. Noise spectral density is a Fourier transform of the autocorrelation function which in the case of white noise is constant (flat) for all frequencies. Any other type of noise is not white and sometimes called "colored". 1/f noise is not white noise because its autocorrelation function is not a Dirac delta function, and samples of a 1/f random variable have pretty strong correlation to each other.

"Prospects for charge sensitive amplifiers in scaled CMOS" (O'Connor et al.) appearing in Nuclear Instruments and Methods in Physics Research, A 480 (2002) 713725 presents a more detailed description of some specific circuit implementations for replacing the feedback resistor commonly used in noise generators by MOSFETs. Thus, a circuit is described in Section 6.4 on page 722 where the feedback resistor is replaced by a MOSFET in the triode region, which uses the gate to channel capacitance with source and drain shorted.

It thus emerges that use of MOSFETs in white noise generators that are used in the linear region to serve as very high impedance resistors is well known. It is also known that a MOSFET does not generate white noise except over a midband region and that the amount of noise generated depends on the quiescent conditions and source resistance. It thus follows that transistors require proper biasing for correct operation and this means that some DC current is always flowing through such a device. DC current is responsible for generating 1/f noise and as a result the generated noise is not white. 1/f noise is a shot noise which is not Gaussian, and in transistors, diodes and other active elements the 1/f noise is directly proportional to a DC current flowing through a device or in some cases to a powered DC current. In addition, the parasitic capacitance of the device also reduces the noise bandwidth, thus reducing the noise amplitude.

It would thus improve the quality of white noise produced by such a MOSFET if the effect of DC bias could be reduced.

SUMMARY OF INVENTION

It is therefore an object of the invention to provide an improved white noise generator based on use a MOSFET operated in its linear region where the effect of DC bias is reduced.

This object is realized in accordance with the invention by a white noise generator comprising a MOSFET operated in its linear region and having zero source-drain DC bias current.

BRIEF DESCRIPTION OF DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

Figure 1:
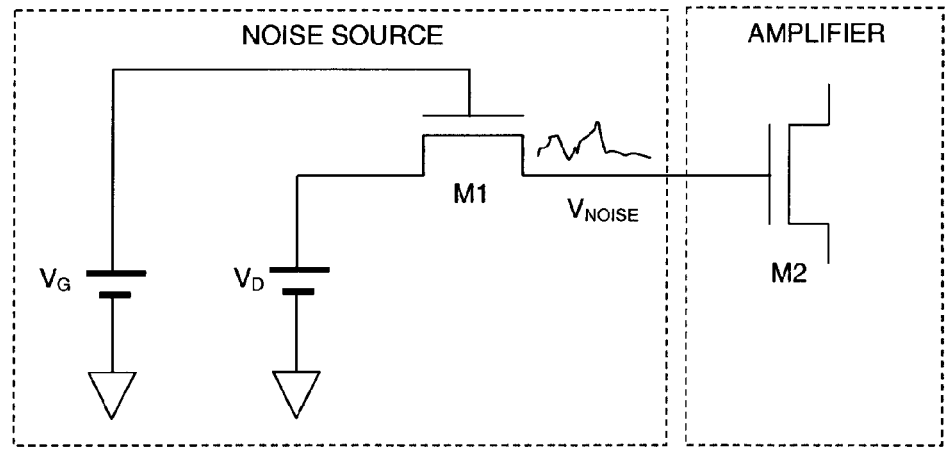
FIG. 1 is a schematic circuit diagram showing a white noise source according to the invention.
Figure 2:
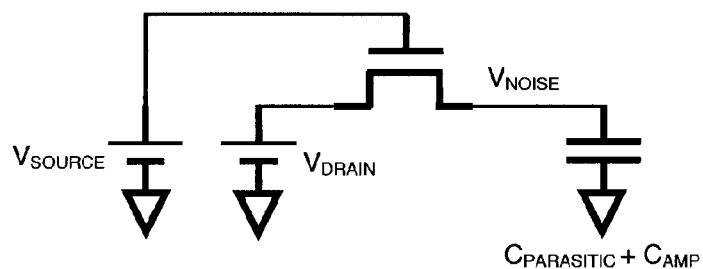
FIG. 2 is a schematic circuit diagram showing the equivalent capacitance of the white noise source illustrated in FIG. 1.

FIG. 1 shows schematically a first MOSFET M1 serving as a source of white noise and a second MOSFET M2 coupled to the noise source M1 and serving as an amplifier. DC bias voltages are shown for biasing the MOSFET M1 so that it operates in its linear region whereby the drain-source resistance is a linear function of the drain-source voltage and current, $V_{DS}$ and $I_{DS}$, respectively. The drain or source of the MOSFET M1 is connected directly to the gate of the MOSFET M2. Thus, assuming that, as shown in the figure, the drain of M1 is connected to the gate of M2, noise is generated at the source of M1. The noise is an AC signal that is superimposed on the DC bias voltage of the source voltage. Considering the electrical path between the drain of M1 and the gate of M2, it is apparent that the gate of M2 serves as an open circuit for the DC bias signal so that no DC current flows from M2 into the gate of M2. Consequently, the DC drain-source voltage $V_{DS}$ is equal to zero.

The following equations show the derivation of the equivalent resistance $R_{DS}$ for such a circuit, where all symbols relate to DC values.

$$I_{DS} = K \cdot \left( (V_{GS} - V_T) \cdot V_{DS} - \frac{V_{DS}^2}{2} \right)$$

$$\frac{\partial I_{DS}}{\partial V_{DS}} = K \cdot (V_{GS} - V_T - V_{DS})$$

$$\left. \frac{\partial I_{DS}}{\partial V_{DS}} \right|_{V_{ds}=0} = K \cdot (V_{GS} - V_T)$$

$$r_{DS} = \frac{1}{K \cdot (V_{GS} - V_T)}$$

The noise source M1 exhibits low 1/f noise since no DC current flowing through the MOSFET, and has a small physical size thus resulting in low parasitic capacitance of the device itself.

The noise magnitude (or RMS noise) generated by the circuit is theoretically independent of $R_{DS}$ and is limited only by $C_{PARASITIC} + C_{AMP}$ (the mathematical proof can be found in literature or calculated by a simple integration).

$$RMS_{V_{NOISE}} \approx \sqrt{\frac{2 \cdot \pi \cdot k \cdot T}{C_{PARASITIC} + C_{AMP}}}$$

where:

k—Boltzmann coefficient

T—temperature in Kelvin.

It is desirable to make capacitances as smaller as possible to get noise signal with larger amplitudes.

Nevertheless, a high value resistor is needed to get a reasonable noise signal even though only the capacitance determines the noise RMS value owing to the bandwidth of the amplifier M2 driven by the noise source M1. The bandwidth of the amplifier M2 is limited so there is no point in creating a noise source M1 whose noise bandwidth is higher than that of the amplifier M2 since the noise will be attenuated outside the range of the amplifier anyway. To this end, it is advisable to design the value of the equivalent resistor $R_{DS}$ of the noise source M1 for use with a given amplifier capacitance $C_{AMP}$ of the amplifier M2, so that the noise bandwidth is slightly higher than the bandwidth of the amplifier. The noise bandwidth is given by:

$$BW_{NOISE} = \frac{1}{2 \cdot \pi \cdot r_{DS} \cdot (C_{PARASITIC} + C_{AMP})} [HZ]$$

Figure 3:
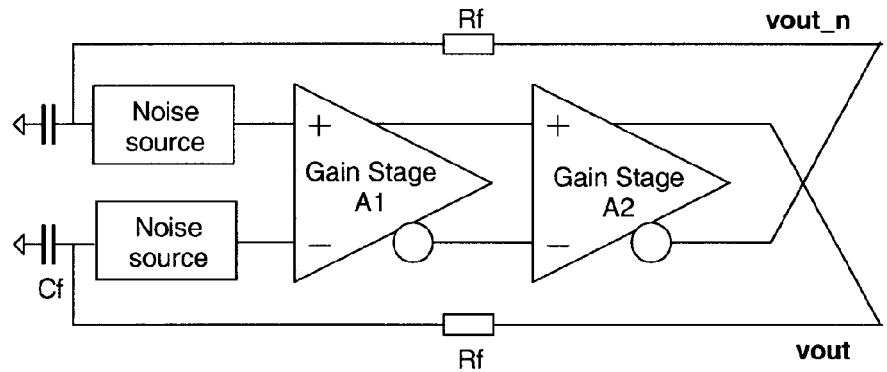
FIG. 3 is a schematic representation of a differential amplifier employing two noise sources according to the invention.

Amplifier offset is much higher than the noise amplitude generated by the noise source. It can cause loss of the noise signal after the amplifier. To this end, there is shown schematically in FIG. 3 a multi-stage differential amplifier whose architecture has been chosen to minimize the offset effect. Thus, respective noise sources (as shown in FIG. 1) are coupled to the positive and negative inputs of a first differential amplifier A1 serving as a first gain stage and whose respective positive and negative outputs are directly connected to the respective positive and negative inputs of a second differential amplifier A2 serving as a second gain stage. The positive output of the second differential amplifier A2 is fed back via a feedback resistor, Rf, to the noise source coupled to the negative input of the first differential amplifier A1. Likewise, the negative output of the second differential amplifier A2 is fed back via a feedback resistor, Rf, to the noise source coupled to the positive input of the first differential amplifier A1. Respective input capacitances associated with both positive and negative inputs are shown as Cf.

At DC and low frequencies the amplifier works as a unity gain amplifier and strong negative feedback disables the effect of the offset. At higher frequencies the feedback is "disabled" and then the noise is amplified by two gain stages. As a further benefit, this topology attenuates 1/f noise since low frequencies are not amplified. Thus, according to such an embodiment, the MOSFET amplifier is configured as a frequency dependent feedback amplifier that operates at DC and low frequencies as a unity gain amplifier and whose feedback is significantly reduced at higher frequencies, whereby 1/f noise is attenuated since low frequencies are substantially not amplified. This property may be realized with other MOSFET amplifiers and is not conditional on the amplifier being a differential amplifier. High value resistors Rf may also be implemented by a MOS transistor operating in the sub-threshold region.

Figure 4:
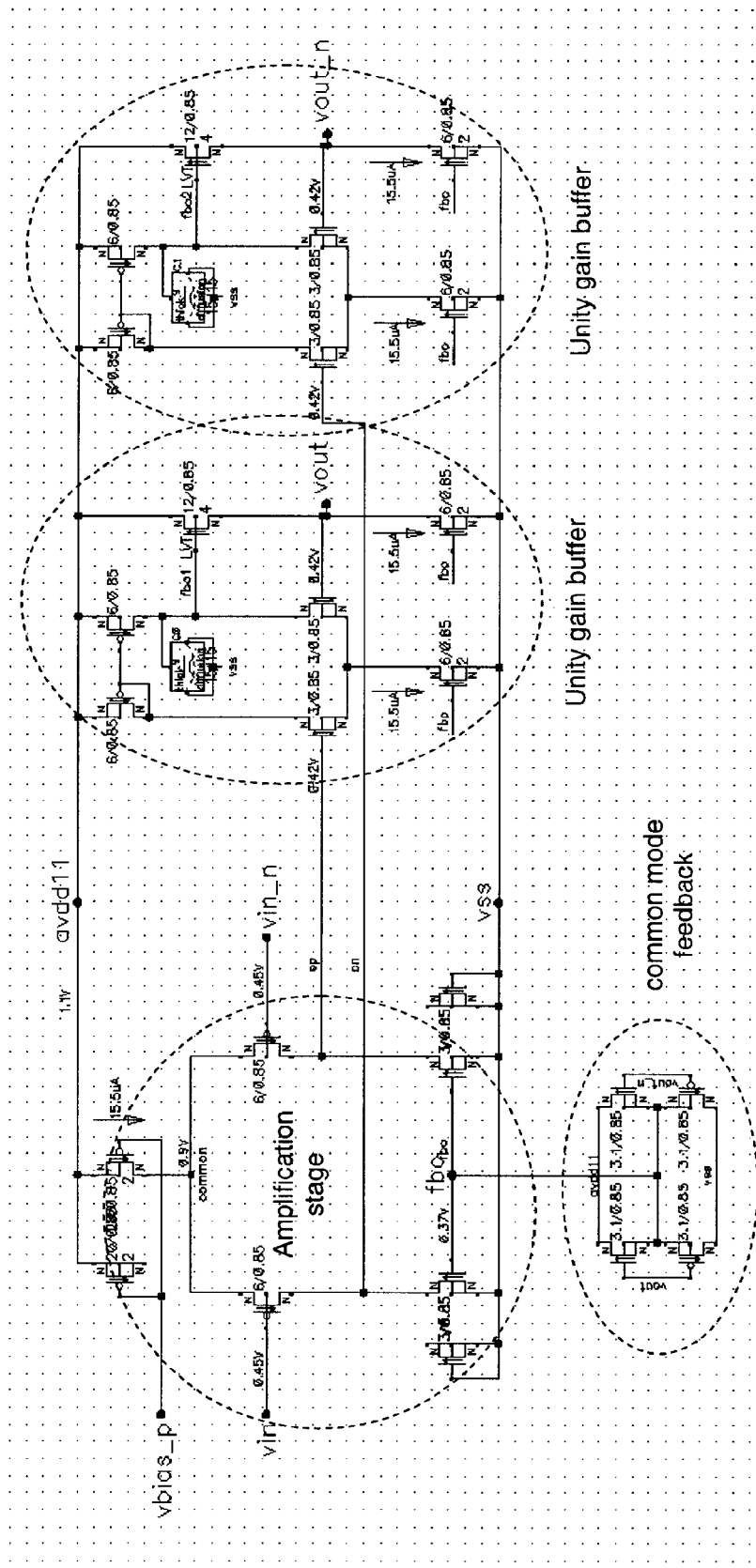
FIG. 4 is a schematic circuit diagram showing an actual implementation of a multi-stage amplifier based on the circuit illustrated in FIG. 3.

FIG. 4 is a schematic circuit diagram showing an actual implementation reduced to practice of the gain stage consisting of an amplification stage and two voltage followers (one on each output). The amplification stage is implemented by a PMOS differential pair loaded by an NMOS active load with a common-mode feedback control. The amplified signal is fed into the voltage followers implemented by a simple differential amplifier in a unity gain configuration.

Gain stage input capacitance should be kept as low as possible in order not to cut the noise bandwidth.

Common mode feedback is used for the following reasons:

a) to keep amplification stage outputs at a stable DC level since its outputs are high impedance nodes.

b) to improve Power Supply Rejection (PSR) performance of the amplifier.

c) to keep the outputs differential.

Current configuration of the followers was chosen for three major reasons:

a) to keep gain stage outputs DC levels at approximately half of the positive power supply voltage applied to the amplifier.

b) to minimize the effect of the process variations. Specifically, it is known that an amplifier with unity voltage gain can be implemented in many ways. The simplest is a source follower, but this shifts the DC level of the output up (or down) compared to the input and its gain strongly depends on the process (manufacturing accuracy, quality of modeling etc.). Therefore, the preferred implementation according to the invention is based on feedback. The voltage gain is 1−1/A where A is a voltage gain of a simple amplifier. Thus, if A is large enough, then the total voltage gain is approximately 1. Even if A changes, the total voltage gain will not be much affected.

c to get low output impedance.

d) to decrease gain loss.

Figure 5:
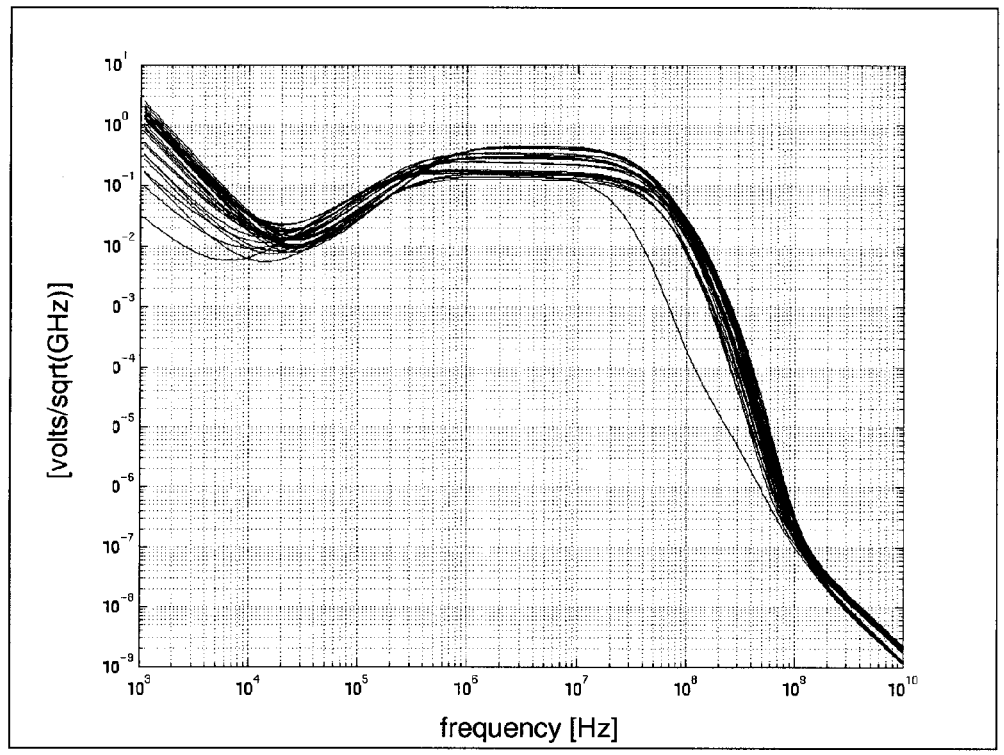
FIG. 5 shows graphically the differential output noise spectral density for the amplifier shown in FIG. 4.

FIG. 5 shows graphically the differential output noise spectral density for the differential amplifier shown in FIG. 4.

Figure 6:
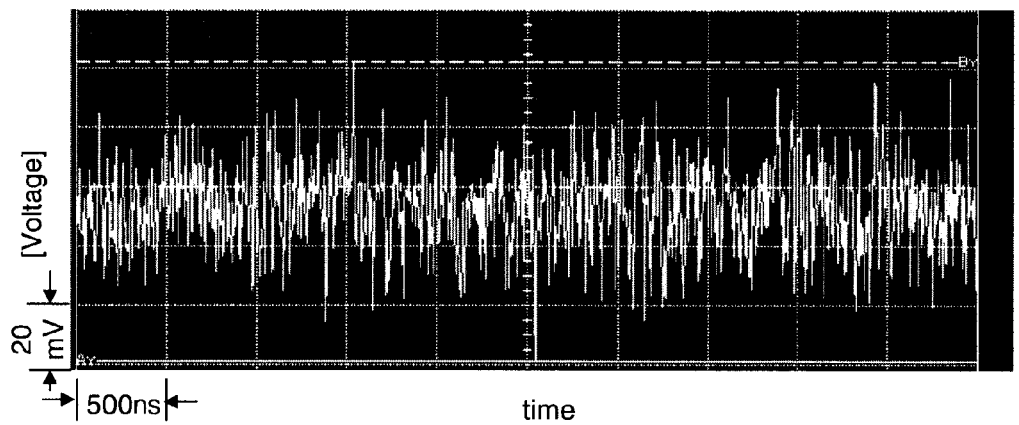
FIG. 6 shows graphically measurement results of the noise source with the differential amplifier as shown in FIG. 4.

FIG. 6 shows graphically measurement results of the noise source with the differential amplifier as shown in FIG. 4.

What is claimed is:

1. A white noise generator comprising a MOSFET operated in its linear region and having zero source-drain DC bias current wherein the source or drain terminal of the MOSFET is connected to a gate terminal of a MOSFET amplifier and wherein the MOSFET amplifier is a multi-stage differential amplifier.

2. The white noise generator according to claim 1, wherein the source and drain terminals are at the same DC potential so as to prevent the flow of DC current through the MOSFET.

3. The white noise generator according to claim 1, wherein the MOSFET amplifier comprises:

a first differential amplifier having positive and negative inputs for coupling to respective noise sources and having respective positive and negative outputs, a second differential amplifier having positive and negative inputs coupled to the positive and negative outputs respectively of the first differential amplifier, a positive output of the second differential amplifier fed back to a noise source coupled to the negative input of the first differential amplifier, and a negative output of the second differential amplifier fed back to a noise source coupled to the positive input of the first differential amplifier.

4. The white noise generator according to claim 1, wherein the MOSFET amplifier is configured as a frequency dependent feedback amplifier that operates at DC and low frequencies as a unity gain amplifier and whose feedback is significantly reduced at higher frequencies, whereby 1/f noise is attenuated since low frequencies are substantially not amplified.

* * * * *